(12) United States Patent
Lilak et al.

(10) Patent No.: US 10,861,870 B2
(45) Date of Patent: Dec. 8, 2020

(54) INVERTED STAIRCASE CONTACT FOR DENSITY IMPROVEMENT TO 3D STACKED DEVICES

(71) Applicant: INTEL CORPORATION, Santa Clara, CA (US)

(72) Inventors: Aaron Lilak, Beaverton, OR (US); Patrick Morrow, Portland, OR (US); Rishabh Mehandru, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 91 days.

(21) Appl. No.: 16/327,628

(22) PCT Filed: Sep. 29, 2016

(86) PCT No.: PCT/US2016/054379
§ 371 (c)(1),
(2) Date: Feb. 22, 2019

(87) PCT Pub. No.: WO2018/063226
PCT Pub. Date: Apr. 5, 2018

(65) Prior Publication Data
US 2019/0189635 A1      Jun. 20, 2019

(51) Int. Cl.
*H01L 23/522* (2006.01)
*H01L 21/8234* (2006.01)
(Continued)

(52) U.S. Cl.
CPC .............. *H01L 27/11582* (2013.01); *H01L 21/823475* (2013.01); *H01L 23/5226* (2013.01);
(Continued)

(58) Field of Classification Search
CPC ............. H01L 23/5226; H01L 23/5283; H01L 23/481; H01L 27/11582; H01L 27/088;
(Continued)

(56) References Cited

U.S. PATENT DOCUMENTS 7,852,676 B2 * 12/2010 Maejima ............ G11C 16/3418
365/185.11
8,513,731 B2 * 8/2013 Lee .................... H01L 27/11578
257/329

(Continued)

OTHER PUBLICATIONS

International Preliminary Report on Patentability for International Patent Application No. PCT/US2016/054379, dated Apr. 11, 2019, 7 pgs.
(Continued)

*Primary Examiner* — Earl N Taylor
(74) *Attorney, Agent, or Firm* — Schwabe, Williamson & Wyatt, P.C.

(57) ABSTRACT

A semiconductor stacked device include a first plurality of device layers separated from one another by a first plurality of dielectric layers, a first electrically conductive via coupled to a contact portion of a device layer of the first plurality of the device layers, a second plurality of device layers separated from one another by a second plurality of dielectric layers, and a second electronically conductive via coupled to a contact portion of a device layer of the second plurality of the device layers. The first electronically conductive via extends to a frontside of the semiconductor stacked device and the second electrically conductive via extends to a backside of the semiconductor stacked device. The first plurality of device layers form a stair pattern in a first direction and the second plurality of device layers form a stair pattern in a second direction inverted from the first direction.

20 Claims, 9 Drawing Sheets

(51) Int. Cl.
  *H01L 23/528* (2006.01)
  *H01L 27/11582* (2017.01)
  *H01L 27/11573* (2017.01)
  *H01L 27/11575* (2017.01)
  *H01L 27/06* (2006.01)
  *H01L 27/088* (2006.01)

(52) U.S. Cl.
  CPC ...... *H01L 23/5283* (2013.01); *H01L 27/0688* (2013.01); *H01L 27/088* (2013.01); *H01L 27/0886* (2013.01); *H01L 27/11573* (2013.01); *H01L 27/11575* (2013.01)

(58) Field of Classification Search
  CPC ......... H01L 27/0886; H01L 21/823475; H01L 27/0688; H01L 27/11573; H01L 27/11575; H01L 27/0694
  See application file for complete search history.

(56) References Cited

U.S. PATENT DOCUMENTS

| | | | |
|---|---|---|---|
| 9,230,984 B1* | 1/2016 | Takeguchi | H01L 27/11556 |
| 9,240,393 B2* | 1/2016 | Yu | H01L 23/3135 |
| 9,425,209 B1* | 8/2016 | Yang | H01L 27/11582 |
| 10,242,965 B2* | 3/2019 | Chiu | H01L 25/0657 |
| 10,276,546 B1* | 4/2019 | Wu | H01L 23/564 |
| 10,373,970 B2* | 8/2019 | Lee | H01L 27/11556 |
| 2009/0277670 A1* | 11/2009 | Booth, Jr. | H05K 3/365 174/255 |
| 2010/0117143 A1* | 5/2010 | Lee | H01L 27/11582 257/329 |
| 2012/0119287 A1* | 5/2012 | Park | H01L 27/11519 257/329 |
| 2012/0280299 A1* | 11/2012 | Yun | H01L 27/11582 257/314 |
| 2014/0061747 A1* | 3/2014 | Tanzawa | H01L 27/11568 257/314 |
| 2014/0061750 A1* | 3/2014 | Kwon | G11C 5/025 257/314 |
| 2015/0372000 A1* | 12/2015 | Jee | H01L 27/11521 257/314 |
| 2016/0071876 A1* | 3/2016 | Mizuno | H01L 27/11582 365/185.17 |
| 2017/0256551 A1* | 9/2017 | Lee | H01L 27/11582 |
| 2019/0189635 A1* | 6/2019 | Lilak | H01L 27/0886 |

OTHER PUBLICATIONS

PCT/US2016/054379, International Search Report and Written Opinion, dated Jun. 23, 2017, 10 page.

* cited by examiner

INVERTED STAIRCASE CONTACT FOR DENSITY IMPROVEMENT TO 3D STACKED DEVICES

RELATED APPLICATION(S)

This application is a national stage filing under 35 U.S.C. § 371 of International Patent Application No. PCT/US2016/054379, filed Sep. 29, 2016, which is hereby incorporated by reference herein in its entirety.

TECHNICAL FIELD

This application relates to 3-dimensional (3D) stacked devices, and particularly to 3D stacked device with signal routing layers stacked vertically.

BACKGROUND

Semiconductor integrated chips can be fabricated in a process that includes imaging, deposition and etching. Additional steps can include doping and cleaning. Wafers (such as mono-crystal silicon wafers, silicon on sapphire wafers or gallium arsenide wafers) can be used as a substrate. Photolithography can be used to mark areas of the wafer for enhancement through doping or deposition. An integrated circuit is composed of a plurality of layers which can include diffusion layers (which can include dopants), implant layers (which can include additional ions), metal layers (defining conduction) and/or via or contact layers (which can define conduction between layers).

DETAILED DESCRIPTION OF PREFERRED EMBODIMENTS

Figure 1:
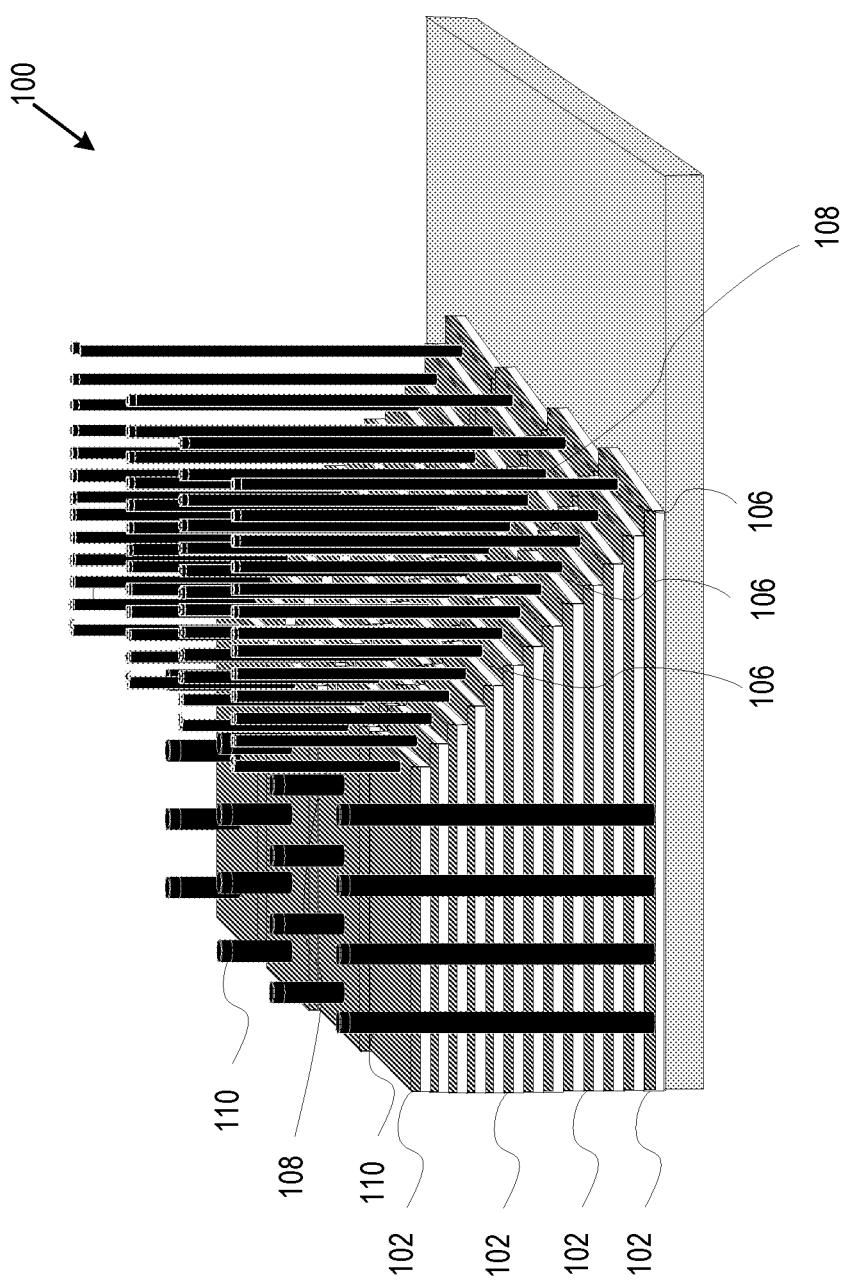
FIG. 1 illustrates a stacked device of a NAND flash memory.

Described herein are systems and methods of manufacturing a semiconductor integrated chip with a stacked device having a first staircase contact formation and a second staircase contact formation inverted from the first staircase contact formation. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention; however, the order of description should not be construed to imply that these operations are necessarily order dependent. In particular, these operations need not be performed in the order of presentation.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

Implementations of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternative materials, which may or may not be combined with silicon, that include but are not limited to germanium, silicon germanium, germanium tin, indium antimonide, lead telluride, indium arsenide, indium phosphide, gallium arsenide, indium gallium arsenide, gallium nitride, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 2:
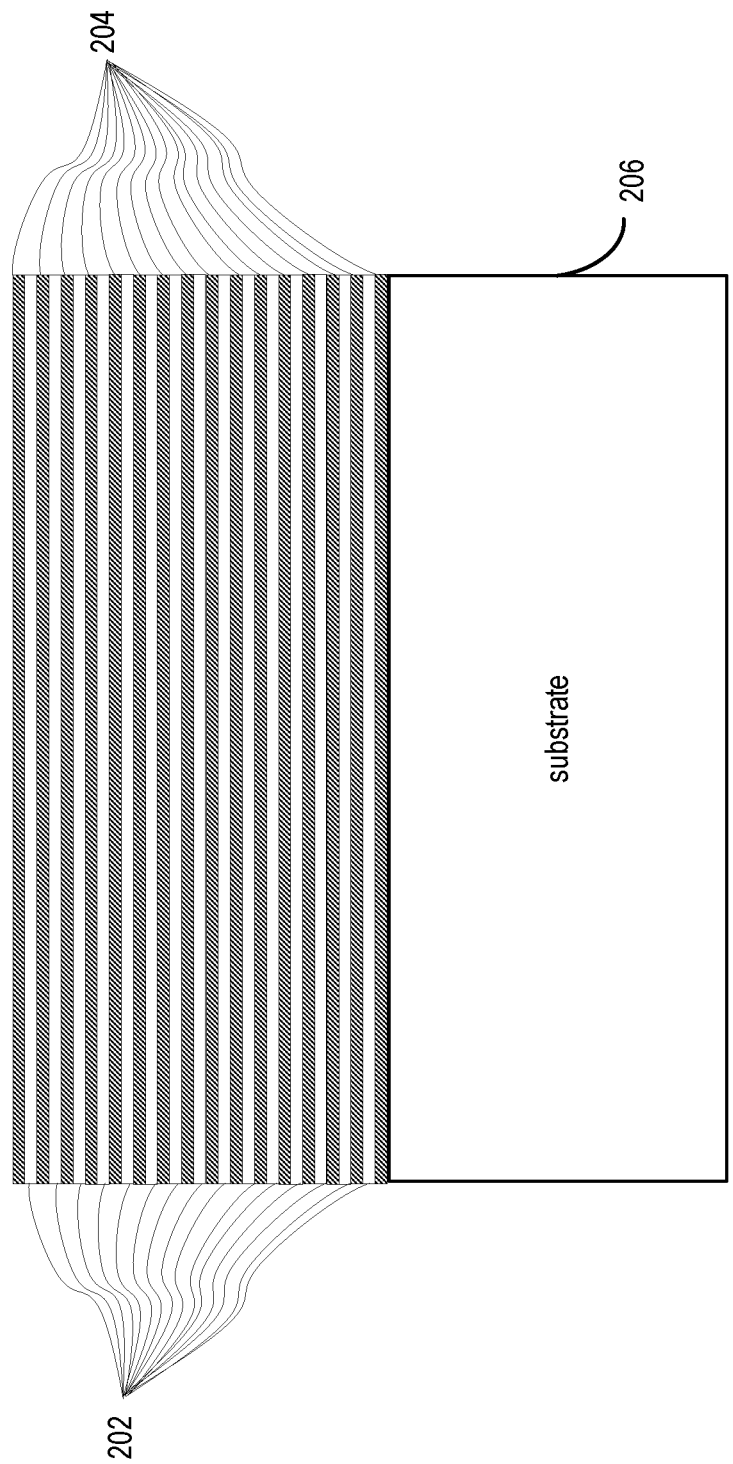
FIG. 2 illustrates a region of an integrated circuit die with deposited device layers with interspersed dielectric material layers.

FIG. 1 illustrates a conventional staircase wordline contact formation 100 of a typical vertical NAND flash architecture on a semiconductor device. The staircase wordline contact formation 100 includes a plurality of wordline plates 102 with contact portions 106 formed into a staircase pattern. Each contact portion 106 provides electrical contact to a different wordline plate 102 of the stacked device. Each contact portion 106 is formed by removing a portion of the wordline plate 102 immediately above the contact portion 106. This results in the contact portions 106 of each wordline plate 102 forming the staircase pattern. A via 108 is etched to connect with each contact portion 106 to provide an electrical connection to the respective wordline plate 102. For example, in a NAND memory, each wordline plate 102 may be connected to a memory cell through the contact portion 106 and the respective via 108. Although FIG. 100 shows a staircase pattern contact structure for a NAND memory, this structure could also be used for contact to any semiconductor device which is formed upon a substrate using stacked layers as shown in FIG. 2.

Each wordline plate 102 is electrically coupled to the gate electrodes of each of the memory cells in each of the immediately adjacent vertical NAND strings. For example, in FIG. 1, each of the wordline plates 102 may be connected to vertical NAND strings 110 as well as individual vias 108. This allows the wordline plates 102 to be electrically coupled to the gate electrode corresponding to a memory cell in each of the immediately adjacent vertical NAND strings 110. Furthermore, the plurality of wordline plates 104 are vertically spaced apart from one another so that each of the memory cells in the vertical NAND string 110 is electrically coupled to a corresponding wordline plate 102. This allows each particular memory cell to be controlled by a corresponding respective wordline plate 102.

When this configuration is implemented within a stacked device, the lateral extent of the staircase is typically on the order of 20+ μm in dimension from multiple sides of the array. The lateral extent, however, depends upon the number of layers that are stacked, the aspect ratio of the via etch process, the aspect ratio of the stairs, and other parameters.

FIGS. 2-6 illustrate the fabrication of a stacked device on a region of an integrated circuit die according to the disclosed technology. The disclosed technology reduces the lateral length of the stacked device up to two times compared to the conventional stacked device of FIG. 1. The stacked device may be any device that uses a stacked formation, such as, but not limited to, the vertical NAND memory discussed above with respect to FIG. 1, a vertical logic circuit, a vertical random access memory (RAM) device, a vertical static RAM (SRAM) device, or a vertical embedded dynamic RAM (eDRAM). These devices may include multiple stacked devices of the disclosed technology on the semiconductor device.

To form the structure of the disclosed technology, alternating layers of dielectric layers 202 and device layers 204 are deposited on a substrate 206, also referred to as a wafer, as shown in FIG. 2.

Figure 3:
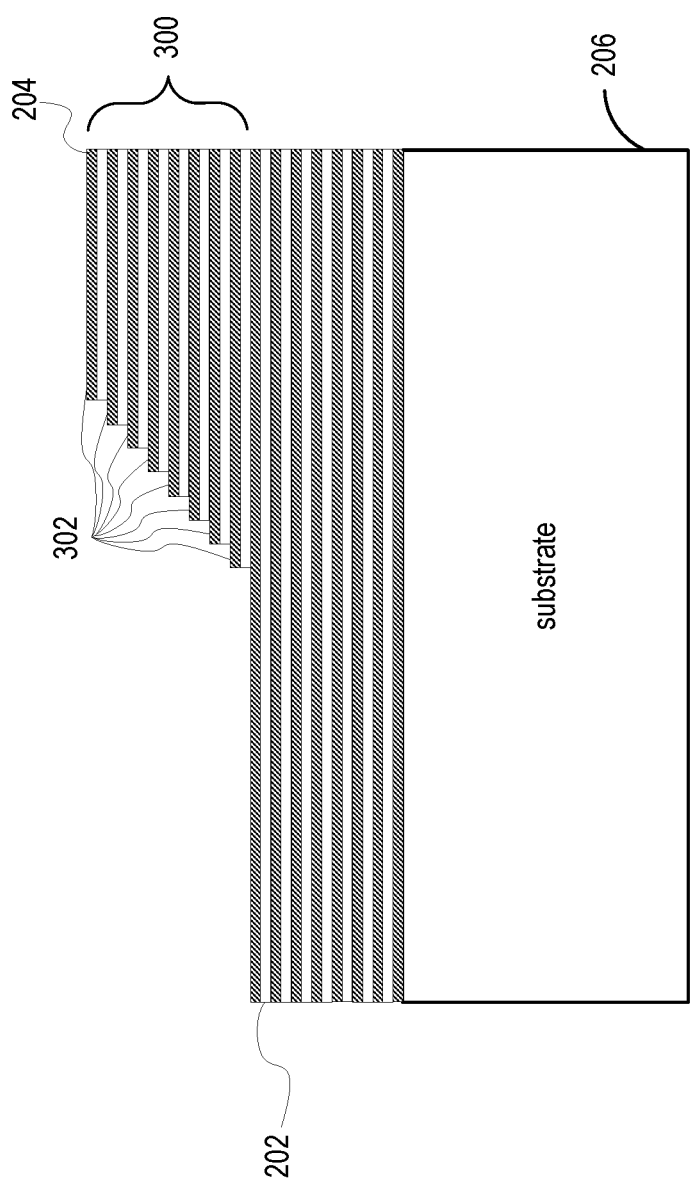
FIG. 3 illustrates the region of the integrated circuit die of FIG. 2 after a frontside processing.
Figure 4:
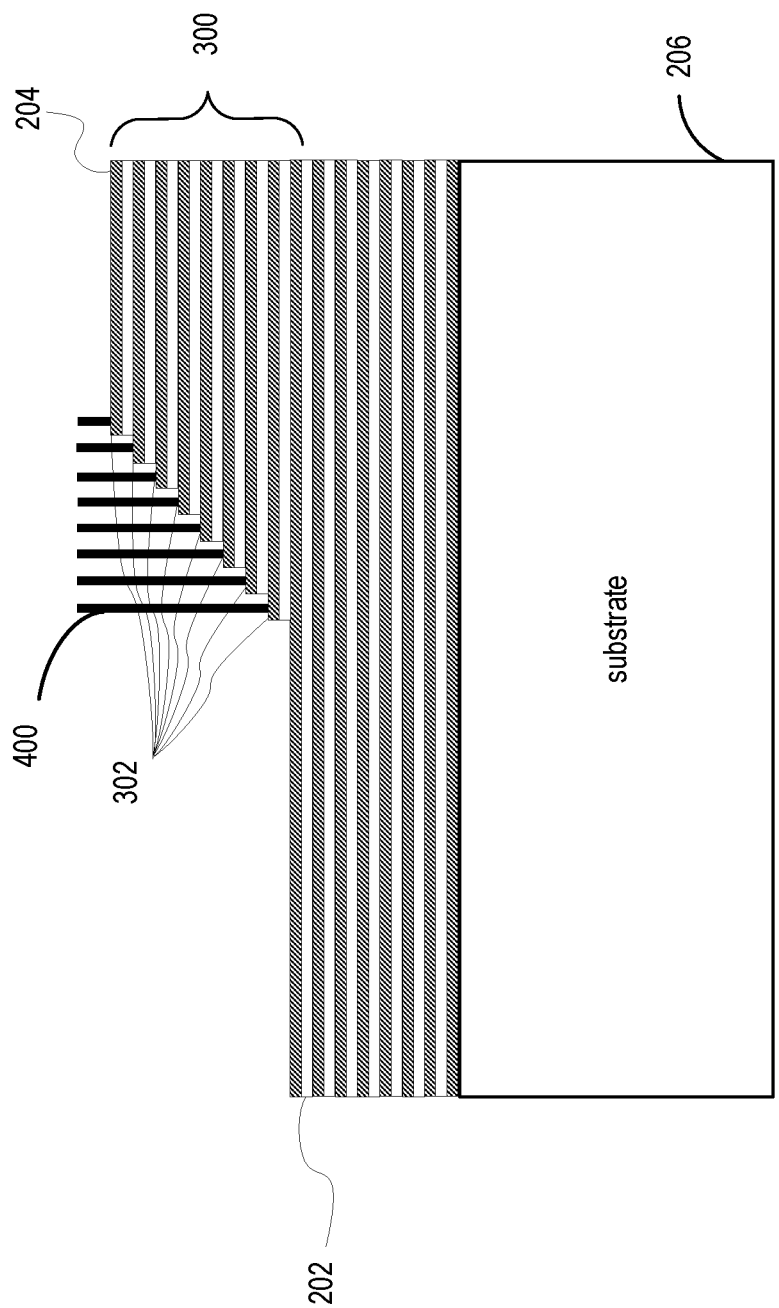
FIG. 4 illustrates the region of the integrated circuit die of FIG. 3 after forming vias with an omitted dielectric layer.
Figure 5:
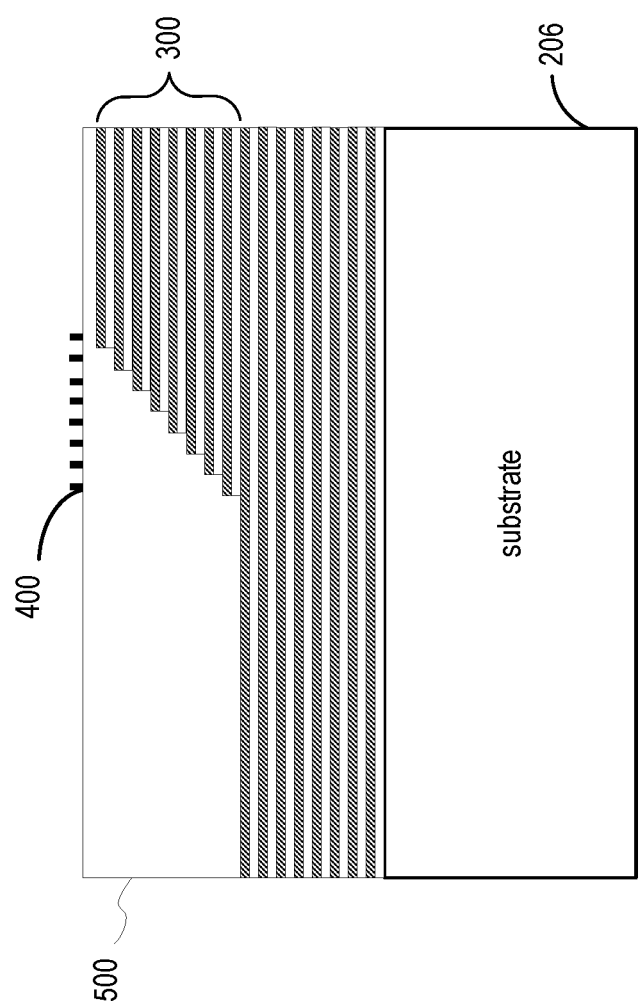
FIG. 5 illustrates the integrated circuit die of FIG. 4 including the dielectric layer.

FIG. 3 illustrates a first staircase etching. A frontside etch staircase 300 is formed for approximately half the dielectric layers 202 and the device layers 204. The frontside etch removes a portion of the dielectric layer 202 and the device layer 204 so as to form contact portions 302 on each of the device layers 204. That is, the dielectric layer 202 and the device layer 204 immediately above the current device layer 204 are etched away to form the contact portion 302 on the current device layer. These contact portions 302 of each of the device layers 204 then form the staircase pattern so that each device layer 204 of the frontside of the integrated die has a readily available contact portion 302. The contact portions 302, also referred to as via contacts, are formed on each of the steps of the staircase 300. As seen in FIG. 4, vias 400 are formed to connect to each of the contact portions 302. The vias 400 extend to the frontside of the stacked device. This provides a direct connection to each of the device layers 204 on the frontside of the stacked device. Although not shown, additional vias may be included that connect to multiple device layers 204, similar to the vertican NAND strings 110 in FIG. 1. The vias 400 are formed laterally relative to the staircase 300. In FIG. 4, an inter layer dielectric film 500 is omitted to show the vias 400 connected to each of the contact portions 302. However, the stacked device with the inter layer dielectric film 500 is shown in FIG. 5.

After the vias 400 are formed and electrically connected to the contact portions 302, the vias 400 may be connected to metal routing as appropriate (not shown) to connect to other devices or components. Although FIGS. 4 and 5 show vias 400 connected to each of the contact portions 302, if routing is not needed at the frontside of the stacked device for that contact portion 302, a via 400 need not be provided. At this point, frontside processing of the stacked device is completed at this point, including frontside metallization.

Figure 6:
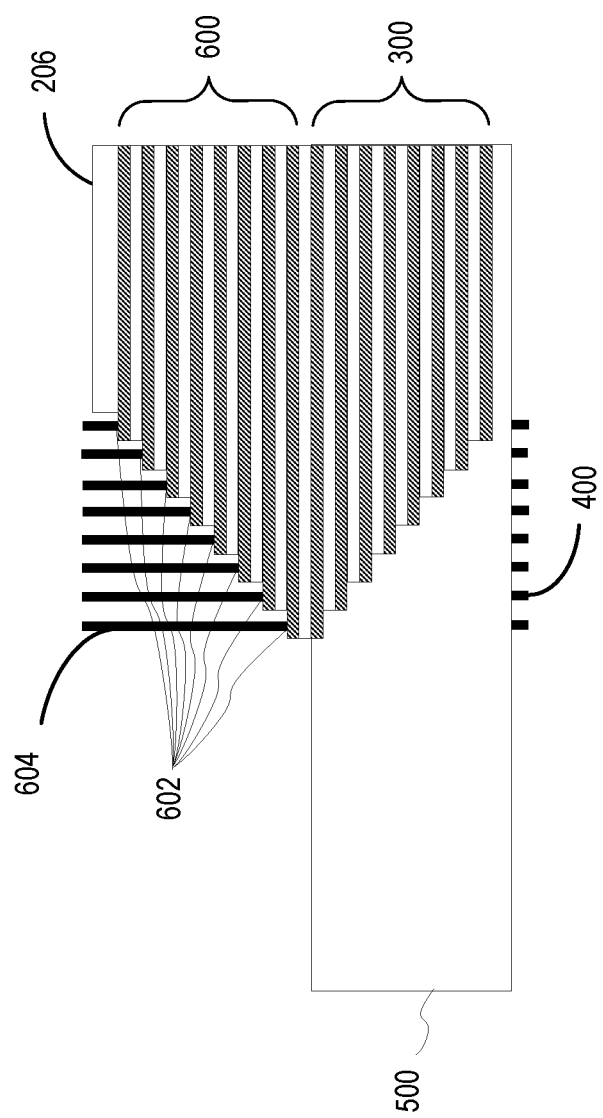
FIG. 6 illustrates the integrated circuit die of FIG. 5 after a backside processing and formed vias with an omitted dielectric layer.

Following the fabrication of the frontside of the wafer, the wafer is subjected to a backside reveal process to remove at least some of the substrate 206 and a backside staircase etch is performed to create a second backside staircase 600. FIG. 6 illustrates the frontside staircase 300 and the backside staircase 600. After the backside reveal process, a portion of the substrate 206 may remain, as seen in FIG. 6, or it may also be removed by the backside reveal process. Similar to the frontside staircase 300, contact portions 602 are formed on each of the steps of the backside staircase 600.

The contact portions 602 are formed by the backside etching process. The backside etch removes a portion of the dielectric layer 202 and the device layer 204 so as to form contact portions 602 on each of the device layers 204 to form the backside staircase 600. That is, the dielectric layer 202 and the device layer 204 immediately adjacent the current device layer 204 are etched away to form the contact portion 602 on the current device layer. These contact portions 602 of each of the device layers 204 then form the backside staircase pattern so that each device layer 204 of the backside of the integrated die has a readily available contact portion 602.

Vias 604 may then be formed to connect to each contact portion 602, as needed. The vias 604 extend to a backside of the stacked device. Although both the frontside staircase 300 and the backside staircase 600 are shown in FIG. 6 as identical in size, each staircase may include any number of device layers 204 and contact portions 302. That is, for example, the frontside staircase 300 may have less "stairs" than the backside staircase 600 or vice versa.

In FIG. 6, the inter layer dielectric layers 700 that would cover the vias 604 are omitted from FIG. 6 to show the connection of the vias 604 with the contact portions 602.

Figure 7:
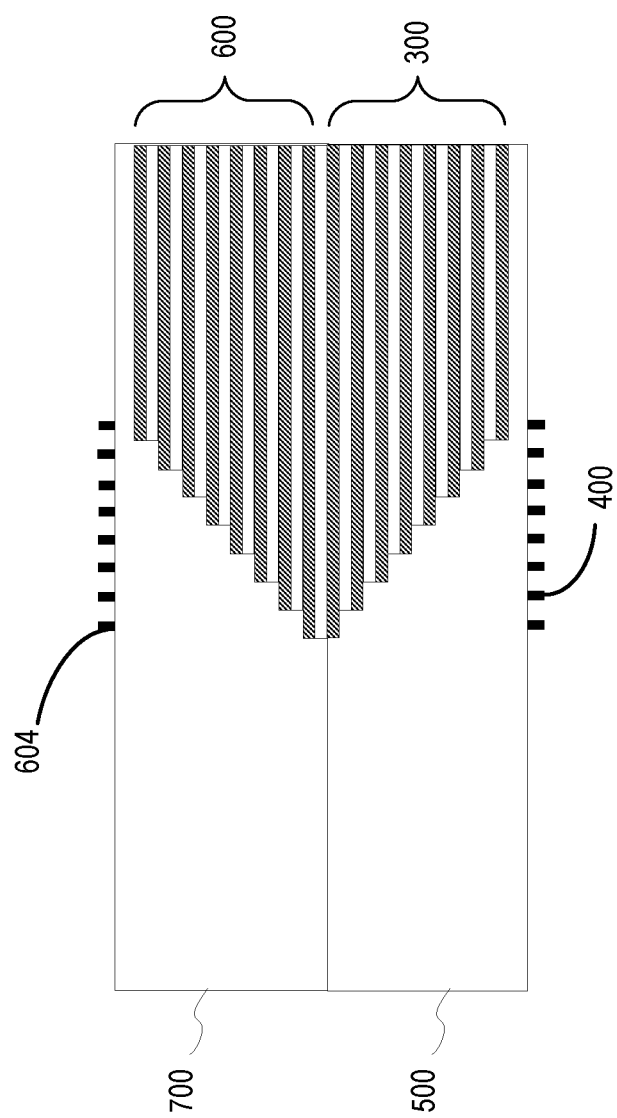
FIG. 7 illustrates the integrated circuit die of FIG. 6 with the dielectric layer according to the disclosed technology.

FIG. 7 illustrates the stacked device with both the frontside staircase 300 and the backside staircase 600 and the dielectric layers 500 and 700. After the backside staircase 600 is formed, the backside metallization may be completed, and if desired, the signal layers from the backside contacts may be routed to the frontside of the wafer. Each of the device layers 204 are then electrically connected to at least one electrical component on the semiconductor device through the connected vias 400 and/or 604.

With the stacked device formation as shown in FIGS. 6 and 7, the extent of the lateral contact material provided outside the array may be reduced up to a factor of two times versus a traditional staircase contact structure. That is, the stacked device of FIG. 7 is half the lateral length of the stacked device of FIG. 1. This is seen because rather than having a single staircase, as seen in FIG. 1, a first staircase is formed on a frontside of the wafer for only a portion of the device layers 204, while an inverted staircase is formed on the backside of the wafer for the remaining device layers 204. Therefore, compared to FIG. 1, the longest stair of the disclosed technology can be up to half the length of longest stair of the conventional stacked device as shown in FIG. 1. That is, the frontside staircase 300 and the backside staircase 600 form a wedge-shaped device.

For example, in a memory device, multiple of the stacked devices shown in FIG. 7 would be formed on multiple sides of each array of the memory, with numerous arrays provided per die. The number of arrays would depend upon the size of the memory. Since the stacked devices of the disclosed technology are up to half the lateral length of the conventional stacked devices of FIG. 1, there is significant density improvement in these architectures. Due to the device layers being reduced in length by a factor of up to two times, there is also a two times reduction of parallel line capacitance between the device layers which combines to provide up to four times a reduction in resistive-capacitive (RC) delay.

Figure 8:
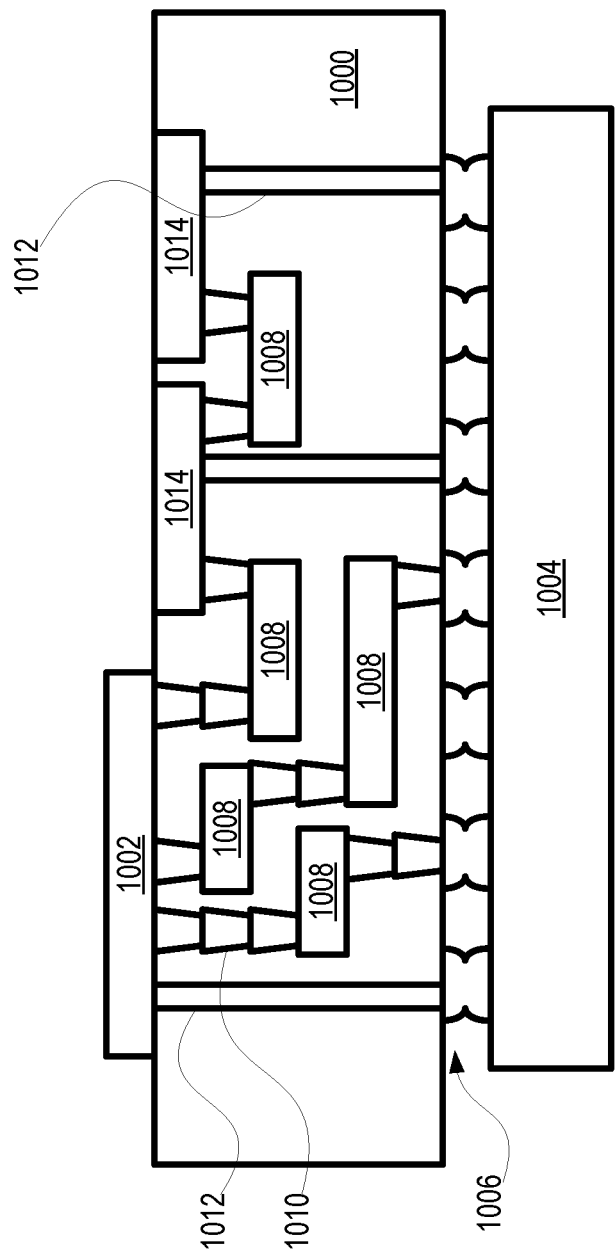
FIG. 8 is an interposer implementing one or more embodiments of the invention.

FIG. 8 illustrates an interposer 1000 that includes one or more embodiments of the invention. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of the interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000.

In accordance with embodiments of the invention, apparatuses or processes disclosed herein may be used in the fabrication of the interposer 1000.

Figure 9:
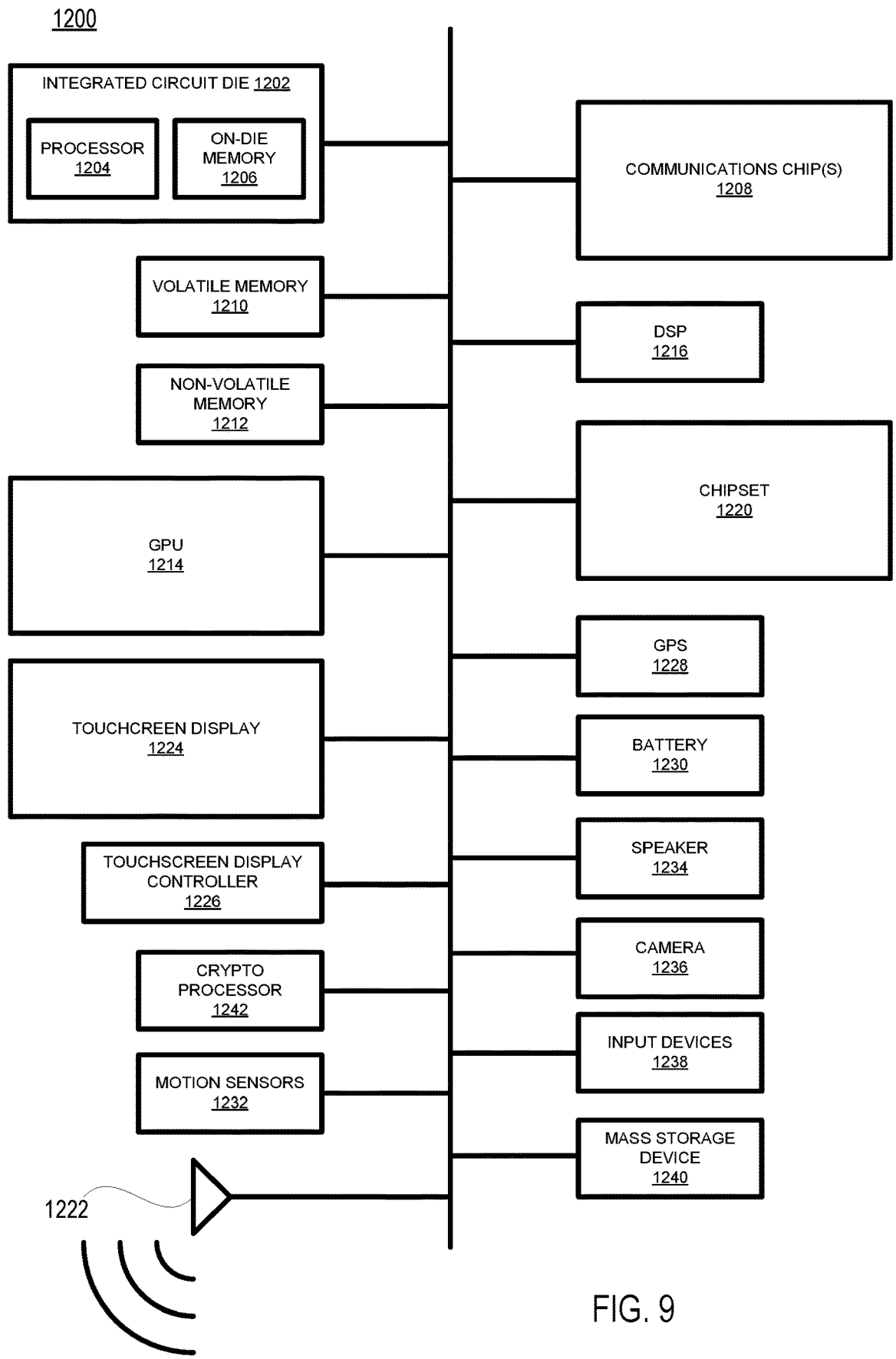
FIG. 9 is a computing device built in accordance with an embodiment of the invention.

FIG. 9 illustrates a computing device 1200 in accordance with one embodiment of the invention. The computing device 1200 may include a number of components. In one embodiment, these components are attached to one or more motherboards. In an alternate embodiment, some or all of these components are fabricated onto a single system-on-a-chip (SoC) die, such as an SoC used for mobile devices. The components in the computing device 1200 include, but are not limited to, an integrated circuit die 1202 and at least one communications logic unit 1208. In some implementations the communications logic unit 1208 is fabricated within the integrated circuit die 1202 while in other implementations the communications logic unit 1208 is fabricated in a separate integrated circuit chip that may be bonded to a substrate or motherboard that is shared with or electronically coupled to the integrated circuit die 1202. The integrated circuit die 1202 may include a CPU 1204 as well as on-die memory 1206, often used as cache memory, that can be provided by technologies such as embedded DRAM (eDRAM), SRAM, or spin-transfer torque memory (STT-MRAM).

The computing device 1200 may include other components that may or may not be physically and electrically coupled to the motherboard or fabricated within an SoC die. These other components include, but are not limited to, volatile memory 1210 (e.g., DRAM), non-volatile memory 1212 (e.g., ROM or flash memory), a graphics processing unit 1214 (GPU), a digital signal processor 1216, a crypto processor 1242 (e.g., a specialized processor that executes cryptographic algorithms within hardware), a chipset 1220, at least one antenna 1222 (in some implementations two or more antenna may be used), a display or a touchscreen display 1224, a touchscreen controller 1226, a battery 1230 or other power source, a power amplifier (not shown), a voltage regulator (not shown), a global positioning system (GPS) device 1228, a compass, a motion coprocessor or sensors 1232 (that may include an accelerometer, a gyroscope, and a compass), a microphone (not shown), a speaker 1234, a camera 1236, user input devices 1238 (such as a keyboard, mouse, stylus, and touchpad), and a mass storage device 1240 (such as hard disk drive, compact disk (CD), digital versatile disk (DVD), and so forth). The computing device 1200 may incorporate further transmission, telecommunication, or radio functionality not already described herein. In some implementations, the computing device 1200 includes a radio that is used to communicate over a distance by modulating and radiating electromagnetic waves in air or space. In further implementations, the computing device 1200 includes a transmitter and a receiver (or a transceiver) that is used to communicate over a distance by modulating and radiating electromagnetic waves in air or space.

The communications logic unit 1208 enables wireless communications for the transfer of data to and from the computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 1208 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 1200 may include a plurality of communications logic units 1208. For instance, a first communications logic unit 1208 may be dedicated to shorter range wireless communications such as Wi-Fi, NFC, and Bluetooth and a second communications logic unit 1208 may be dedicated to longer range wireless communications such as GPS, EDGE, GPRS, CDMA, WiMAX, LTE, Ev-DO, and others.

The CPU 1204 of the computing device 1200 includes one or more stacked devices with a frontside staircase contact formation and a backside inverted staircase contact formation, that are formed in accordance with embodiments of the invention. The term "processor" may refer to any device or portion of a device that processes electronic data from registers and/or memory to transform that electronic data into other electronic data that may be stored in registers and/or memory.

The communications logic unit 1208 may also include one or more stacked devices with a frontside staircase contact formation and a backside inverted staircase contact formation, that are formed in accordance with embodiments of the invention.

In further embodiments, another component housed within the computing device 1200 may contain one or more stacked devices with a frontside staircase contact formation and a backside inverted staircase contact formation, that are formed in accordance with embodiments of the invention.

In various embodiments, the computing device 1200 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

EXAMPLE EMBODIMENTS

Example 1 is a semiconductor stacked device. The semiconductor stacked device includes a first variety of device layers separated from one another by a first variety of dielectric layers, where the first variety of device layers form a stair pattern in a first direction. The semiconductor stacked device includes a first electrically conductive via attached to a contact portion of a device layer of the first variety of the device layers, where the first electronically conductive via extends to a frontside of the semiconductor stacked device. The semiconductor stacked device includes a second variety of device layers separated from one another by a second variety of dielectric layers, where the second variety of device layers form a stair pattern in a second direction inverted from the first direction. The semiconductor stacked device further includes a second electronically conductive via attached to a contact portion of a device layer of the second variety of the device layers, where the second electrically conductive via extends to a backside of the semiconductor stacked device.

Example 2 is the semiconductor stacked device of Example 1, further including a variety of first electrically conductive vias, each first electrically conductive attached to a contact portion of a device layer of the first variety of device layers, where each of the variety of the first electrically conductive vias extend to the frontside of the semiconductor stacked device.

Example 3 is a semiconductor stacked device of any one of Examples 1 or 2, further including a variety of second electrically conductive vias, each second electrically conductive via attached to a contact portion of a device layer of the second variety of device layers, where each of the variety of the second electrically conductive vias extend to the backside of the semiconductor stacked device.

Example 4 is a semiconductor stacked device of Example 1, where the first electrically conductive via connects the respective device layer to an electrical component and the second electrically conductive via connects the respective device layer to another electrical component.

Example 5 is a semiconductor stacked device of Example 1, further including a third electrically conductive via attached to at a portion of the device layers of the first variety of device layers or the second variety of device layers.

Example 6 is a semiconductor stacked device of Example 1, where the number of device layers in the first variety of device layers is greater than the number of device layers in the second variety of device layers.

Example 7 is a semiconductor stacked device of Example 1, where the number of device layers in the first variety of device layers is greater than the number of device layers in the second variety of device layers.

Example 8 is a semiconductor stacked device of any one of Example 1, where a proximal device layer of the first variety of device layers to the frontside of the semiconductor stacked device is shorter than distal a device layer of the first variety of device layers to the frontside of the semiconductor stacked device.

Example 9 is a semiconductor stacked device of any one of Examples 1 and 8, where a proximal device layer of the second variety of device layers to the backside of the semiconductor stacked device is shorter than a distal device layer of the second variety of device layers distal to the backside of the semiconductor stacked device.

Example 10 is a semiconductor stacked device of any ones of Examples 1-9, where the stacked device is included in at least one of a vertical logic circuit, a vertical random access memory (RAM) device, a vertical static RAM (SRAM) device, or a vertical embedded dynamic RAM (eDRAM) device.

Example 11 is a method of forming a semiconductor stacked device. The method includes depositing a variety of device layers on a substrate, with a bottom device layer deposited directly on the substrate, and depositing a variety of dielectric layers, each dielectric layer positioned between at least two device layers. The method includes etching a top portion of the variety of device layers and a top portion of the variety of dielectric layers to form a contact portion on each device layer of the top portion of the variety of device layers, the contact portions forming a first stair pattern. The method includes removing at least a portion of the substrate to reveal the bottom device layer, and etching a bottom portion of the variety of device layers, the bottom portion of the variety of device layers including the bottom device layer and a bottom portion of the variety of dielectric layers to form a contact portion on each device layer of the bottom portion of the variety of device layers, the contact portion forming a second stair pattern inverted from the first stair pattern.

Example 12 is the method of Example 11, where the number of device layers in the top portion of the variety of device layers is equal to the number of device layers of the bottom portion of the variety of device layers.

Example 13 is the method of Example 11, where the number of device layers in the top portion of the variety of device layers is greater than the number of device layers of the bottom portion of the variety of device layers.

Example 14 is the method of any one of Examples 11-13, where a top device layer and the bottom device layer of the variety of device layers is shorter in length than the remaining device layers of the variety of device layers.

Example 15 is the method of Example 11, further including removing all of the substrate to reveal the bottom device layer.

Example 16 is the method of Example 11, further including forming a variety of vias, each via electronically connected to at least one contact portion of the top portion of the variety of the device layers, each via extending to a frontside of the semiconductor stacked device.

Example 17 is the method of Example 11 or 16, further including forming a variety of vias, each via electronically connected to at least one contact portion of the bottom portion of the variety of the device layers, each via extending to a backside of the semiconductor stacked device.

Example 18 is the method of Example 17, further including electrically connecting the variety of contact portions to at least one electrical component through the variety of vias.

Example 19 is a computing device. The computer devices includes a processor mounted on a substrate, a memory unit capable of storing data, and a graphics processing unit. The computer devices includes an antenna within the computer device, a display on the computing device; and a battery within the computing device. The computer devices includes a power amplifier within the processor. The computer devices includes and a voltage regulator within the processor, where the processor comprises a first variety of device layers separated from one another by a first variety of dielectric layers, where the first variety of device layers form a stair pattern in a first direction, and a first electrically conductive via attached to a contact portion of a device layer of the first variety of the device layers, where the first electronically conductive via extends to a frontside of the semiconductor stacked device. The computer devices includes and a voltage regulator within the processor, where the processor comprises a second variety of device layers separated from one another by a second variety of dielectric layers, where the second variety of device layers form a stair pattern in a second direction inverted from the first direction, and a second electronically conductive via attached to a contact portion of a device layer of the second variety of the device layers, where the second electrically conductive via extends to a backside of the semiconductor stacked device.

Example 20 is the computing device of Example 19, where a proximal device layer of the first variety of device layers to the frontside of the semiconductor stacked device is shorter than a distal device layer of the first variety of device layers to the frontside of the semiconductor stacked device, and where a proximal device layer of the second variety of device layers to the backside of the semiconductor stacked device is shorter than a distal device layer of the second variety of device layers to the backside of the semiconductor stacked device.

Example 21 is the computing device of Example 19, where the processor further comprises a variety of first electrically conductive vias, each first electrically conductive via attached to a contact portion of a device layer of the first variety of device layers, where each of the variety of the first electrically conductive vias extend to the frontside of the semiconductor stacked device.

Example 22 is the computing device of any one of Examples 19 or 21, where the processor further comprises a variety of second electrically conductive vias, each second electrically conductive via attached to a contact portion of a device layer of the second variety of device layers, where each of the variety of the second electrically conductive vias extend to the backside of the semiconductor stacked device.

Example 23 is the computing device of Example 19, where the first electrically conductive via connects the respective device layer to an electrical component and the second electrically conductive via connects the respective device layer to another electrical component.

Example 24 is the computing device of Example 19, further including a third electrically conductive via attached to at a portion of the device layers of the first variety of device layers or the second variety of device layers.

Example 25 is the computing device of Example 19, where the number of device layers in the first variety of device layers is greater than the number of device layers in the second variety of device layers.

Example 26 is the computing device of Example 19, where the number of device layers in the first variety of device layers is greater than the number of device layers in the second variety of device layers.

Example 27 is the computing device of any ones of Examples 19-26, where the processor is at least one of a vertical logic circuit, a vertical random access memory (RAM) device, a vertical static RAM (SRAM) device, or a vertical embedded dynamic RAM (eDRAM) device.

Some of the infrastructure that can be used with embodiments disclosed herein is already available, such as general-purpose computers, mobile phones, computer programming tools and techniques, digital storage media, and communications networks. A computing device may include a processor such as a microprocessor, microcontroller, logic circuitry, or the like. The computing device may include a computer-readable storage device such as non-volatile memory, static random access memory (RAM), dynamic RAM, read-only memory (ROM), disk, tape, magnetic, optical, flash memory, or other computer-readable storage medium.

Various aspects of certain embodiments may be implemented using hardware, software, firmware, or a combination thereof. A component or module may refer to, be part of, or include an application specific integrated circuit (ASIC), an electronic circuit, a processor (shared, dedicated, or group), and/or memory (shared, dedicated or group) that execute one or more software or firmware programs, a combinational logic circuit, and/or other suitable components that provide the described functionality. As used herein, a software module or component may include any type of computer instruction or computer executable code located within or on a non-transitory computer-readable storage medium. A software module or component may, for instance, comprise one or more physical or logical blocks of computer instructions, which may be organized as a routine, program, object, component, data structure, etc., which performs one or more tasks or implements particular abstract data types.

In certain embodiments, a particular software module or component may comprise disparate instructions stored in different locations of a computer-readable storage medium, which together implement the described functionality of the module or component. Indeed, a module or component may comprise a single instruction or many instructions, and may be distributed over several different code segments, among different programs, and across several computer-readable storage media. Some embodiments may be practiced in a distributed computing environment where tasks are performed by a remote processing device linked through a communications network.

Although the foregoing has been described in some detail for purposes of clarity, it will be apparent that certain changes and modifications may be made without departing from the principles thereof. It should be noted that there are many alternative ways of implementing both the processes and apparatuses described herein. Accordingly, the present embodiments are to be considered illustrative and not restrictive, and the disclosure is not to be limited to the details given herein, but may be modified within the scope and equivalents of the appended claims.

Those having skill in the art will appreciate that many changes may be made to the details of the above-described embodiments without departing from the underlying principles of the disclosure. The scope of the present disclosure should, therefore, be determined only by the following claims.

The invention claimed is:

1. A semiconductor stacked device comprising:
 a first plurality of device layers separated from one another by a first plurality of dielectric layers, wherein the first plurality of device layers form a stair pattern in a first direction;
 a first electrically conductive via coupled to a contact portion of a device layer of the first plurality of the device layers, wherein the first electronically conductive via extends to a frontside of the semiconductor stacked device;
 a second plurality of device layers separated from one another by a second plurality of dielectric layers, wherein the second plurality of device layers form a stair pattern in a second direction inverted from the first direction; and
 a second electronically conductive via coupled to a contact portion of a device layer of the second plurality of the device layers, wherein the second electrically conductive via extends to a backside of the semiconductor stacked device.

2. The semiconductor stacked device of claim 1, further comprising a plurality of first electrically conductive vias, each first electrically conductive via coupled to a contact portion of a device layer of the first plurality of device layers, wherein each of the plurality of the first electrically conductive vias extend to the frontside of the semiconductor stacked device.

3. The semiconductor stacked device of claim 1, further comprising a plurality of second electrically conductive vias, each second electrically conductive via coupled to a contact portion of a device layer of the second plurality of device layers, wherein each of the plurality of the second electrically conductive vias extend to the backside of the semiconductor stacked device.

4. The semiconductor stacked device of claim 1, wherein the first electrically conductive via connects the respective device layer to an electrical component and the second electrically conductive via connects the respective device layer to another electrical component.

5. The semiconductor stacked device of claim 1, further comprising a third electrically conductive via coupled to at a portion of the device layers of the first plurality of device layers or the second plurality of device layers.

6. The semiconductor stacked device of claim 1, wherein the number of device layers in the first plurality of device layers is greater than the number of device layers in the second plurality of device layers.

7. The semiconductor stacked device of claim 1, wherein the number of device layers in the first plurality of device layers is greater than the number of device layers in the second plurality of device layers.

8. The semiconductor stacked device of claim 1, wherein a proximal device layer of the first plurality of device layers to the frontside of the semiconductor stacked device is shorter than distal a device layer of the first plurality of device layers to the frontside of the semiconductor stacked device.

9. The semiconductor stacked device of claim 1, wherein a proximal device layer of the second plurality of device layers to the backside of the semiconductor stacked device is shorter than a distal device layer of the second plurality of device layers distal to the backside of the semiconductor stacked device.

10. The semiconductor stacked device of claim 1, wherein the stacked device is included in at least one of a vertical logic circuit, a vertical random access memory (RAM) device, a vertical static RAM (SRAM) device, or a vertical embedded dynamic RAM (eDRAM) device.

11. A method of forming a semiconductor stacked device, comprising:
   depositing a plurality of device layers on a substrate, with a bottom device layer deposited directly on the substrate;
   depositing a plurality of dielectric layers, each dielectric layer positioned between at least two device layers;
   etching a top portion of the plurality of device layers and a top portion of the plurality of dielectric layers to form a contact portion on each device layer of the top portion of the plurality of device layers, the contact portions forming a first stair pattern;
   removing at least a portion of the substrate to reveal the bottom device layer; and
   etching a bottom portion of the plurality of device layers, the bottom portion of the plurality of device layers including the bottom device layer and a bottom portion of the plurality of dielectric layers to form a contact portion on each device layer of the bottom portion of the plurality of device layers, the contact portion forming a second stair pattern inverted from the first stair pattern.

12. The method of claim 11, wherein the number of device layers in the top portion of the plurality of device layers is equal to the number of device layers of the bottom portion of the plurality of device layers.

13. The method of claim 11, wherein the number of device layers in the top portion of the plurality of device layers is greater than the number of device layers of the bottom portion of the plurality of device layers.

14. The method of claim 11, wherein a top device layer and the bottom device layer of the plurality of device layers is shorter in length than the remaining device layers of the plurality of device layers.

15. The method of claim 11, further comprising removing all of the substrate to reveal the bottom device layer.

16. The method of claim 11, further comprising forming a plurality of vias, each via electronically connected to at least one contact portion of the top portion of the plurality of the device layers, each via extending to a frontside of the semiconductor stacked device.

17. The method of claim 11, further comprising forming a plurality of vias, each via electronically connected to at least one contact portion of the bottom portion of the plurality of the device layers, each via extending to a backside of the semiconductor stacked device.

18. The method of claim 17, further comprising electrically connecting the plurality of contact portions to at least one electrical component through the plurality of vias.

19. A computing device comprising:
   a processor mounted on a substrate;
   a memory unit capable of storing data;
   a graphics processing unit;
   an antenna within the computer device;
   a display on the computing device;
   a battery within the computing device;
   a power amplifier within the processor; and
   a voltage regulator within the processor;
   wherein the processor comprises:
      a first plurality of device layers separated from one another by a first plurality of dielectric layers, wherein the first plurality of device layers form a stair pattern in a first direction; and
      a first electrically conductive via coupled to a contact portion of a device layer of the first plurality of the device layers, wherein the first electronically conductive via extends to a frontside of the semiconductor stacked device;
      a second plurality of device layers separated from one another by a second plurality of dielectric layers, wherein the second plurality of device layers form a stair pattern in a second direction inverted from the first direction; and
      a second electronically conductive via coupled to a contact portion of a device layer of the second plurality of the device layers, wherein the second electrically conductive via extends to a backside of the semiconductor stacked device.

20. The computing device of claim 19, wherein a proximal device layer of the first plurality of device layers to the frontside of the semiconductor stacked device is shorter than a distal device layer of the first plurality of device layers to the frontside of the semiconductor stacked device, and wherein a proximal device layer of the second plurality of device layers to the backside of the semiconductor stacked device is shorter than a distal device layer of the second plurality of device layers to the backside of the semiconductor stacked device.

* * * * *